US009214914B2

(12) United States Patent
Tsukada

(10) Patent No.: US 9,214,914 B2
(45) Date of Patent: Dec. 15, 2015

(54) AUDIO DEVICE CONTROL PROGRAM, MOBILE TELEPHONE, RECORDING MEDIUM, AND CONTROL METHOD

(71) Applicant: Yamaha Corporation, Hamamatsu-shi, Shizuoka (JP)

(72) Inventor: Keisuke Tsukada, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/385,909

(22) PCT Filed: Feb. 28, 2013

(86) PCT No.: PCT/JP2013/055540
§ 371 (c)(1),
(2) Date: Sep. 17, 2014

(87) PCT Pub. No.: WO2013/140994
PCT Pub. Date: Sep. 26, 2013

(65) Prior Publication Data
US 2015/0079952 A1    Mar. 19, 2015

(30) Foreign Application Priority Data

Mar. 19, 2012 (JP) ................................ 2012-061970

(51) Int. Cl.
*H03G 3/20* (2006.01)
*H04M 1/725* (2006.01)
*H04W 4/16* (2009.01)

(52) U.S. Cl.
CPC ............. *H03G 3/20* (2013.01); *H04M 1/72533* (2013.01); *H04M 1/72597* (2013.01); *H04W 4/16* (2013.01); *G08C 2201/93* (2013.01)

(58) Field of Classification Search
CPC ............... H03G 3/20; H04M 1/72533; H04M 1/72597; H04W 4/16; H04W 4/02; H04W 8/18; H04W 4/00; G08C 2201/93; H04L 29/08108
See application file for complete search history.

(56) References Cited

U.S. PATENT DOCUMENTS

2006/0265726 A1* 11/2006 Byun et al. ..................... 725/40
2007/0124424 A1   5/2007 Matsuda
(Continued)

FOREIGN PATENT DOCUMENTS

JP    2005-295272 A    10/2005
JP    2006-129219 A    5/2006
(Continued)

OTHER PUBLICATIONS

Corresponding International Search Report dated May 28, 2013 with English Translation (five (5) pages).
(Continued)

Primary Examiner — Ted Wang
(74) Attorney, Agent, or Firm — Crowell & Moring LLP

(57) ABSTRACT

Provided is a control program of an audio device which performs automatic control on the audio device so as not to interfere with a telephone call. A control unit of a mobile telephone equipped with a telephone communication unit is caused to function as an operation detector that detects a user operation, an incoming call detector that detects an incoming telephone call to the telephone communication unit, and a command transmitter that communicates with an audio device that outputs a reproduced sound, and the command transmitter transmits a command message containing control contents corresponding to the user operation to the audio device when the operation detector detects the user operation, and transmits a command message for controlling the reproduced sound to the audio device when the incoming call detector detects the incoming telephone call.

7 Claims, 6 Drawing Sheets

(56) References Cited

U.S. PATENT DOCUMENTS

2008/0043938 A1* 2/2008 Yasuda ................. 379/88.08
2008/0137883 A1* 6/2008 Araki ..................... 381/107

FOREIGN PATENT DOCUMENTS

JP 2007-110338 A 4/2007
JP 2009-4823 A 1/2009

OTHER PUBLICATIONS

Japanese-language Written Opinion dated May 28, 2013 (PCT/ISA/237) (four (4) pages).

"AV Controller", Yamaha, http://jp.yamaha.com/news_events/audio-visual/11040401/ Mar. 12, 2012, (three (3) pages).

* cited by examiner

| | REPRODUCTION SOURCE (DVD, USB, AND THE LIKE) | AV SOURCE (STB, TV) | AUDIO SOURCE (FM) |
|---|---|---|---|
| DEFAULT SETTING | PAUSE | MUTE | Vol. down (-10dB) |
| 090-xxxx-xxxx | PAUSE | MUTE | MUTE |
| ⋮ | ⋮ | ⋮ | ⋮ |
| 090-yyyy-yyyy | PAUSE | NONE | NONE |

AUDIO DEVICE CONTROL PROGRAM, MOBILE TELEPHONE, RECORDING MEDIUM, AND CONTROL METHOD

TECHNICAL FIELD

The present invention relates to an audio device control program for controlling an audio device from a mobile telephone such as a smart phone, a mobile telephone equipped with the audio device control program, recording medium, and a control method.

BACKGROUND ART

The mobile telephone such as a smart phone is capable of containing functions other than a calling function which is a basic function, by installing an application program (a so-called App). Some application programs access an Audio/Video (AV) system, and perform a selection of an input source according to a user operation, and an adjustment of reproduced sound volume through a wireless LAN (Local Area Network) (Wi-Fi) (refer to Non Patent Literature 1).

CITATION LIST

Non Patent Literature

Non Patent Literature 1: "Control App "AV CONTROLLER" dedicated for Yamaha AV receiver", [online], Yamaha Corporation, [searched on Mar. 12, 2012], the Internet <URL: http://jp.yamaha.com/news_events/audio-visual/11040401/>

SUMMARY OF INVENTION

Technical Problem

The application program of Non Patent Literature 1 enables a user to control the AV system using a mobile telephone in the hand. However, the application program is intended to perform control in accordance with a user operation for the AV system, and does not include a function of reducing the sound volume of the AV system so as not to interfere with a telephone call when receiving the telephone call, which is a basic function of the mobile telephone.

An object of the present invention is to provide an audio device control program and a mobile telephone, which perform automatic control for an audio device so as not to interfere with a telephone call.

Solution to Problem

An audio device control program provided by a first aspect of the present invention causes a control unit of a mobile telephone equipped with a telephone communication unit to function as: an operation detector that detects a user operation; an incoming call detector that detects an incoming telephone call to the telephone communication unit; and a command transmitter that communicates with an audio device that outputs a reproduced sound, wherein the command transmitter transmits a command message containing control contents corresponding to the user operation to the audio device when the operation detector detects the user operation, and transmits a command message for controlling the reproduced sound to the audio device when the incoming call detector detects the incoming telephone call.

In the audio device control program, the audio device control program may cause the control unit of the mobile telephone to further function as an operation state obtainer that obtains an operation state of the audio device, and the command transmitter may transmit a command message containing control contents corresponding to the operation state of the audio device at that time when the incoming call detector detects the incoming telephone call.

In the audio device control program the operation state obtainer may obtain the operation state of the audio device including an audio source selected in the audio device, and the command transmitter may transmit a command message containing control contents corresponding to the audio source selected in the audio device at that time when the incoming call detector detects the incoming telephone call.

In the audio device control program, the incoming call detector may obtain a caller's number from the telephone communication unit, and the command transmitter may transmit an individual command message according to the obtained caller's number when the incoming call detector detects the incoming telephone call.

In the audio device control program, the command message may indicate at least one of lowering a sound volume of the reproduced sound, muting the reproduced sound, reproducing the reproduced sound, and stopping the reproduced sound.

In the audio device control program, the incoming call detector may further detect that a state of the incoming telephone call or a state of a telephone call is ended, and the command transmitter may transmit a command message containing control contents for returning to a state before the incoming call detector detects the incoming telephone call to the audio device when the incoming call detector detects that the the state of the incoming telephone call or the state of the telephone call is ended.

A mobile telephone provided by a second aspect of the present invention includes a storage unit that stores the audio device control program, a telephone communication unit that performs a telephone communication, and a control unit that executes the audio device control program stored in the storage unit.

A non-transitory storage medium provided by a third aspect of the present invention stores therein the audio device control program.

A control method provided by a fourth aspect of the present invention is a control method for controlling a control unit of a mobile telephone equipped with a telephone communication unit, the control method including controlling the control unit to function as: an operation detector that detects a user operation; an incoming call detector that detects an incoming telephone call to the telephone communication unit; and a command transmitter that communicates with an audio device that outputs a reproduced sound, wherein the command transmitter transmits a command message containing control contents corresponding to the user operation to the audio device when the operation detector detects the user operation, and transmits a command message for controlling the reproduced sound to the audio device when the incoming call detector detects the incoming telephone call.

A control method provided by a fifth embodiment of the present invention is a control method for controlling an audio device from a mobile telephone equipped with a telephone communication unit, the control method including: detecting a user operation; detecting an incoming telephone call to the telephone communication unit; and communicating with an audio device that outputs a reproduced sound, transmitting a command message containing control contents corresponding to the user operation to the audio device when the user operation is detected, and transmitting a command message for controlling the reproduced sound to the audio device when the incoming telephone call is detected.

Advantageous Effects of Invention

According to the present invention, it is possible to control a reproduced sound of an audio device, without the operation of the user, when a mobile telephone receives a call.

DESCRIPTION OF EMBODIMENTS

Figure 1:
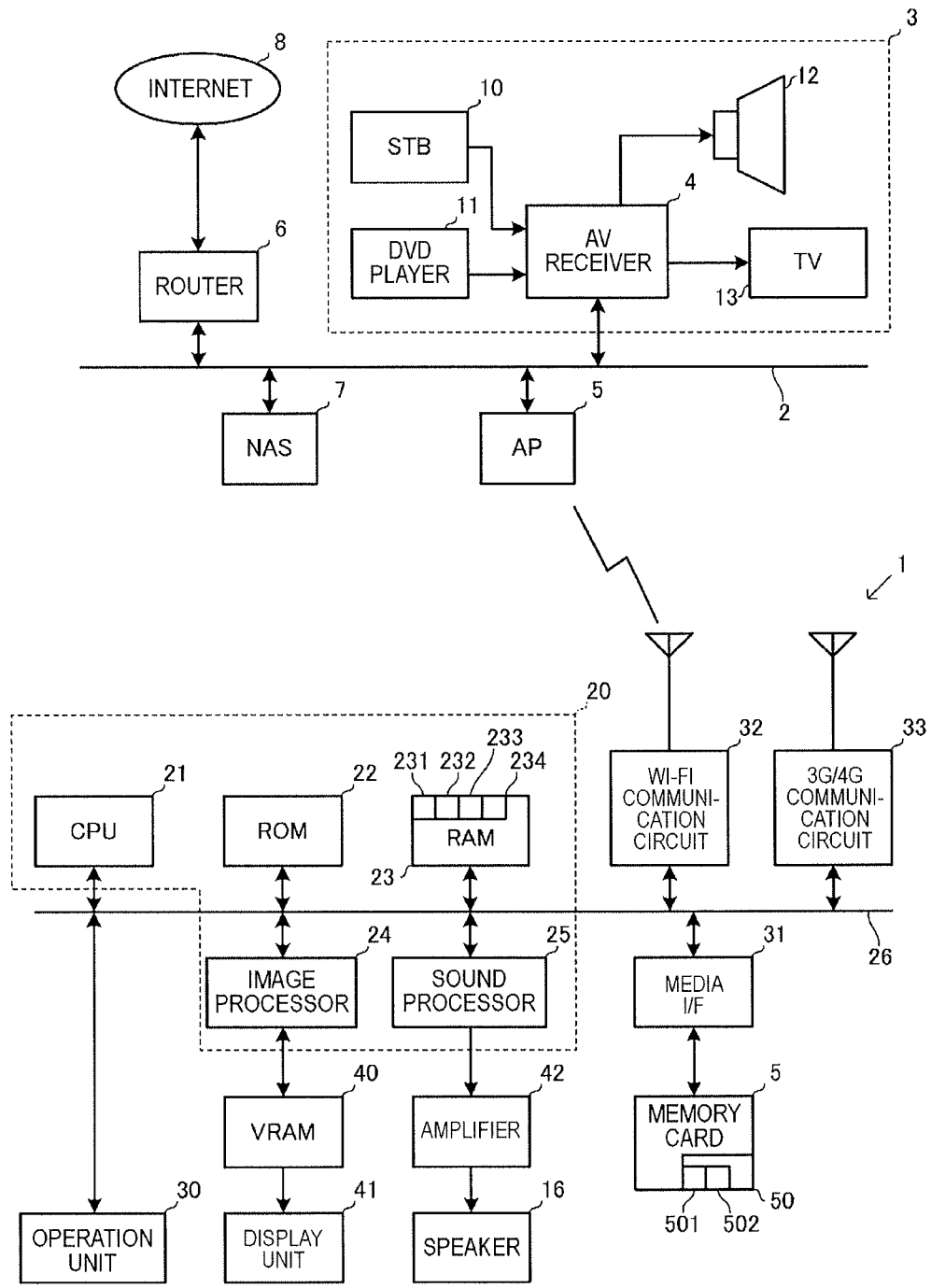
FIG. 1 is a configuration diagram of a mobile telephone and an AV system to which the present invention is applied.

FIG. 1 is a diagram illustrating configurations of a mobile telephone 1 and an AV system 3, to which the present invention is applied.

The mobile telephone 1 is a type which is a so-called smart phone. The mobile telephone (smart phone) 1 has a 3G/4G, which are mobile communication networks, communication function and a wireless LAN (Wi-Fi) communication function, and is connected to a network 2 through an access point 5. An AV receiver 4, which is the core of the AV system 3, is also connected to the network 2.

The mobile telephone 1 can control the AV system 3 (AV receiver 4) through the network 2 according to the user operation by starting an AV controller program 50 which is an application program (App). Further, the mobile telephone 1 performs control such as lowering of the reproduced sound volume of the AV system 3 according to the incoming telephone call, regardless of the user operation, such that the reproduced sound of the AV system 3 does not interfere with the telephone call.

The AV system 3 has a configuration in which a set top box (STB) 10, a Digital Versatile Disc (DVD) player 11, a speaker 12, and a television (TV) 13 are connected to the AV receiver 4 which is the core device, and the AV receiver 4 is connected to the network 2. The AV receiver 4 selects any one of a plurality of AV sources, outputs the reproduced (received) image of the AV source to the TV 13, and outputs the reproduced (received) sound to the speaker 12. The selection of the AV source, the adjustment of a sound volume, and the like are possible by directly operating an operation panel of the AV receiver 4 or an attached infrared remote controller, but may be performed using the mobile telephone 1. In addition, the configuration of the AV system 3 is not limited to the illustrated configuration.

A router 6, a network storage (NAS) 7, and the like are connected to the network 2, in addition to the AV receiver 4 and the access point 5. The router 6 is connected to the Internet 8. The AV receiver 4 has a function of accessing an Internet radio station through the network 2, the router 6, and the Internet 8, and of reproducing content from an Internet radio. Further, the network storage 7 stores music data such as MP3 files. Further, the AV receiver 4 has a function of accessing the network storage 7 through the network 2, and of reproducing the music data stored in the network storage 7.

The mobile telephone 1 includes a control unit 20, an operation unit 30, a media interface 31, a Wi-Fi communication circuit 32 and a 3G/4G communication circuit 33 on a bus 26. The control unit 20 includes a Central Processing Unit (CPU) 21, a Read Only Memory (ROM) (flash memory) 22, a Random Access Memory (RAM) 23, an image processor 24, and a sound processor 25. A video RAM (VRAM) 40 is connected to the image processor 24, and a display unit 41 is connected to the VRAM 40. The display unit 41 includes a liquid crystal display, and displays a standby screen, a telephone number, or the like. In addition, the screen of an AV controller 100, which will be described later, is displayed on the display unit 41. An amplifier 42 including a D/A converter is connected to the sound processor 25, and the speaker 16 is connected to the amplifier 42.

The image processor 24 includes a Graphics Processing Unit (GPU) capable of rendering the standby screen, the telephone number, and the like to be displayed on the display unit 41 and of generating various images. The image processor 24 generates an image of the AV controller according to an instruction of the CPU 21, and draws the generated image on the VRAM 40. The sound processor 25 includes a Digital Signal Processor (DSP) that encodes/decodes a call voice. The sound processor 25 outputs the decoded/generated sound to the amplifier 42. The amplifier 42 amplifies the sound signal and outputs the amplified signal to the speaker 16.

The Wi-Fi communication circuit 32 performs wireless communication of the IEEE802.11g standard with the wireless access point 5, and performs transmission and reception of data and messages with devices on the network 2 such as the AV receiver 4. A message of the format defined in the Digital Living Network Alliance (DLNA) is exchanged between the Wi-Fi communication circuit 32 and the AV receiver 4. The 3G/4G communication circuit 33 performs a voice telephone call and data communication, through a mobile phone communication network. The downloading of an application program is performed by data communication.

Figures 4, 5A:
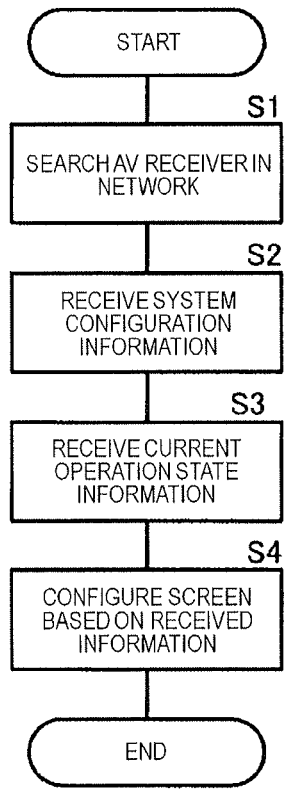
FIG. 4 is a diagram illustrating an example of an incoming-call-time command table which is set in a memory.
FIG. 5A is a flow chart illustrating an operation of an AV controller.

The operation unit 30 includes a touch panel provided on the display unit 41, and detects a touch operation and a flick operation on the touch panel. A memory card 5 is connected to the media interface 31. The memory card 5 is, for example, a micro SD card. The application program which is downloaded from the server by the 3G/4G communication circuit 33 is stored in the memory card 5 or the ROM 22. In FIG. 1, the AV control program 50 is stored in the memory card 5. The AV control program 50 includes data required for the execution of a program, and stores a command table 501 and an incoming-call-time command table 502, as the data required for execution of the program. The command table 501 is a table in which the control contents of the AV system 3 and the command representing the contents are associated. As illustrated in FIG. 4, the incoming-call-time command table 502 is a table which stores the control contents (command) for the AV system 3 in a case of receiving a call, and the control contents for each input source which is selected at that time is stored according to the default setting and caller (telephone number of an incoming call). The control contents according to the caller may be set by the user performing a setting operation.

A work area used when the CPU 21 executes the AV controller program 50 is set in the RAM 23. As the work area, a system configuration storage area 231, an operation state storing area 232, an incoming flag 233 and an incoming control register 234, and the like are set. The system configuration storage area 231 stores the configuration of the AV system 3, which is acquired from the AV receiver 4. The system configuration relates to the devices connected to the upstream and downstream of the AV receiver 4, an input source capable of being selected by the AV receiver 4, and the like. The operation state storing area 232 stores the operation state of the current AV system 3 (AV receiver 4). The operation state of the AV system 3 is the selected input source, a sound volume value, the title of music being reproduced, and the like. The incoming flag 233 is a flag indicating that the mobile telephone 1 is in an incoming call state or in a connected call state (by an incoming call). Further, the incoming control register 234 stores the control contents that are to be automatically performed at a time of reception of a call. The AV controller 100 (see FIG. 2) returns the state of the AV system 3 to the original state by performing control opposite to the control contents at a telephone call end time.

The ROM 22 stores a basic program for executing a telephone call of the mobile terminal device 1 and the application program. Further, the ROM 22 is a flash memory, and is capable of storing a downloaded application program and the like in addition to the basic program.

Figure 2:
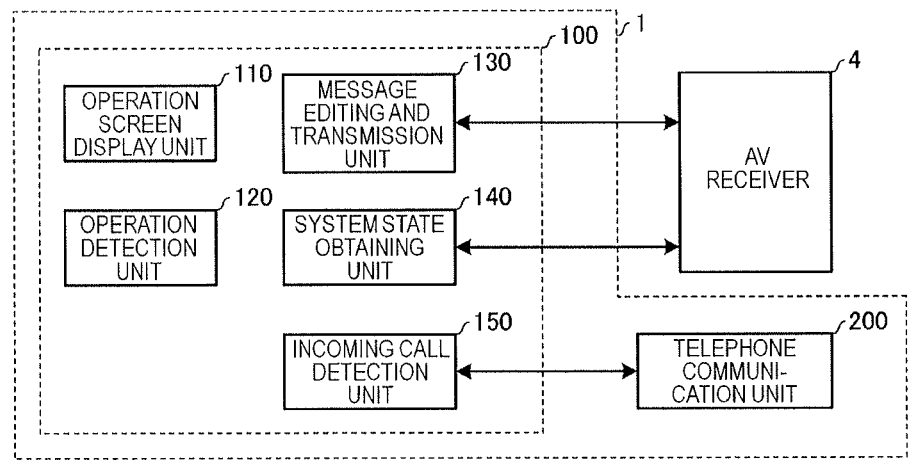
FIG. 2 is a functional block diagram of an AV controller which is configured with the mobile telephone and an AV system control program.

The mobile telephone 1 configures the AV controller 100 illustrated in FIG. 2 in association with the AV controller program 50 stored in the memory card 5, and controls the AV system 3 by transmitting a command message to the AV receiver 4 through Wi-Fi.

With reference to the functional block diagram of FIG. 2, the AV controller 100 implemented by reading the AV controller program 50 in the memory card 5 onto the mobile telephone 1 (hardware) will be described.

The AV controller 100, which is implemented by reading the AV controller program 50 in the memory card 5 into the mobile terminal device 1, includes an operation screen display unit 110, an operation detection unit 120, a message editing and transmission unit 130, a system state obtaining unit 140 and an incoming call detection unit 150.

Figure 3:
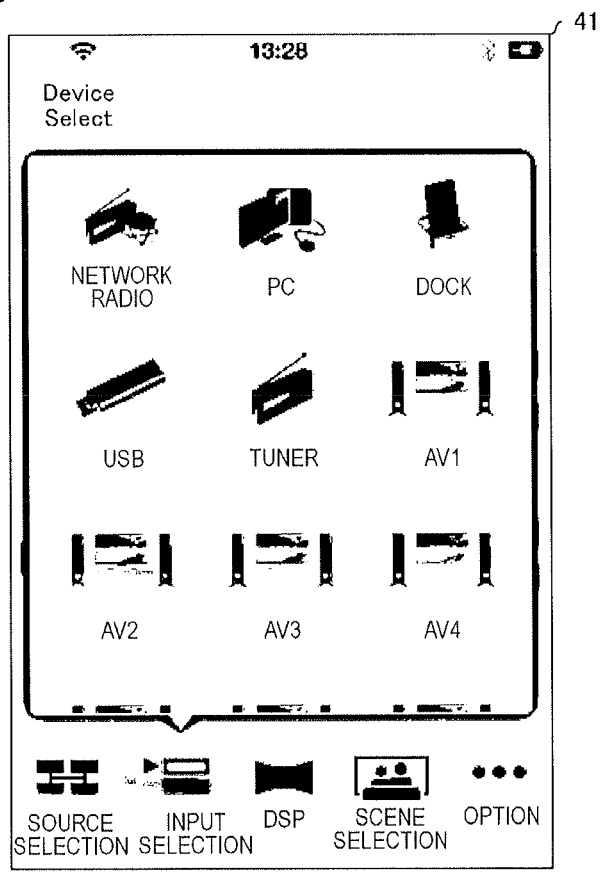
FIG. 3 is a diagram illustrating an example of a screen display of an AV controller.

The operation screen display unit 110 is implemented by the cooperation of the control unit 20, the VRAM 40, the display unit 41, and the AV controller program 50, and for example, an operation screen illustrated in FIG. 3 is displayed on the display unit 41 of the mobile telephone 1. The operation screen illustrated in FIG. 3 is an example of a selection screen of the input source. Further, the operation detection unit 120 is implemented by the cooperation of the control unit 20, the operation unit 30, and the AV controller program 50, and detects the operation with respect to the operation screen displayed on the display unit 41. In FIG. 3, if the user clicks a desired one among input sources (an Internet radio, a PC, a DOCK, a USB, a tuner, an AV1, and the like) displayed on the screen, the operation detection unit 120 detects the operation and inputs the operation information to the message editing and transmission unit 130.

The message editing and transmission unit 130 is implemented by the cooperation of the control unit 20, the Wi-Fi communication circuit 32 and the AV controller program 50, and edits the command message corresponding to the operation information, based on the operation information which is input from the operation detection unit 120 so as to transmit the edited command message to the AV receiver 4. Further, as will be describe later, the message editing and transmission unit 130 edits a predetermined command message, regardless of the user operation, and transmits the edited command message to the AV receiver 4, when the mobile telephone 1 receives a telephone call.

The system state obtaining unit 140 is implemented by the cooperation of the control unit 20, the Wi-Fi communication circuit 32, and the AV controller program 50, and queries the operation state of the current AV system 3 with respect to the AV receiver 4, regularly (for example, every five seconds) and at the time of editing of the command message. The operation state of the AV system 3 contains, for example, information such as a selectable input source, a selected input source, the title of music being reproduced, and a sound volume value.

The incoming call detection unit 150 is a functional unit which is implemented by the cooperation of the control unit 20 and the AV controller program. The incoming call detection unit 150 makes an inquiry to the telephone communication unit 200 which is implemented by the mobile telephone 1 (hardware) and a basic program and obtains the call status. The call status is information indicating the state of the voice (video) telephone call such as an on-hold call state, an incoming call state, an outgoing call state, and a connected call state. If the call status changes, the incoming call detection unit 150 notifies the change to the message editing and transmission unit 130.

The message editing and transmission unit 130 edits the command message containing the contents of controlling the reproduced sound such as reducing the reproduced sound volume, at a time of reception of a call when the call status changes from an on-hold call state to an incoming call state (regardless of the user operation) and transmits the edited command message to the AV receiver 4. This enables preventing the reproduced sound of the AV system 3 from interfering with the telephone call. Further, at an incoming call (telephone call) end time when the call status changes from an incoming call state or a connected call state to an on-hold call state, the message editing and transmission unit 130 transmits the command message containing contents opposite to that of the incoming call time to the AV receiver 4, and returns the operation of the AV system 3 to the original state.

FIG. 4 is a diagram illustrating a configuration of the incoming-call-time command table 502 provided in the message editing and transmission unit 130 (memory card 5). The table stores the control contents with respect to the AV system 3 at the telephone incoming call time, in other words, the contents of the command to be transmitted to the AV receiver 4. The table stores the command according to the audio source which is selected in the AV system 3 at the time of an incoming telephone call.

In the default setting, a command for controlling the AV system 3 with the following contents is stored:

putting a pause when the selected audio source is a reproduction source (pause possible) such as a DVD and a USB;

muting a sound when the selected audio source is an AV reception source including an image (TV or the like); and lowering the sound volume (−10 dB) when the selected audio source is a reception source of only audio (FM or the like).

Further, since the telephone number of a caller is capable of being obtained at the time of reception of a call, it is possible to set the control contents for each telephone number. In the example of the table, a command for controlling the AV system 3 with the following contents, when the caller is 090-xxxx-xxxx, is stored:

putting a pause when the selected audio source is a reproduction source;

muting a sound when the selected audio source is an AV reception source; and muting the sound when the selected audio source is a reception source of only audio.

A command for controlling the AV system 3 with the following contents, when the caller is 090-yyyy-yyyy, is stored:

putting a pause when the selected audio source is a reproduction source;

doing nothing when the selected audio source is an AV reception source; and doing nothing when the selected audio source is a reception source of only audio.

FIG. 5A to FIG. 7 are flow charts illustrating an operation of the AV controller 100.

FIG. 5A is a flow chart illustrating an operation when the AV controller program 50 which is an application program is started. The AV receiver 4 in the network 2 is searched (S1), the configuration information of the current system and the current operation state information are received from the detected AV receiver 4 (S2, S3). Then, the screen of the AV controller such as an input source selection screen or a volume slider is configured based on the received information (S4).

Figure 5B:
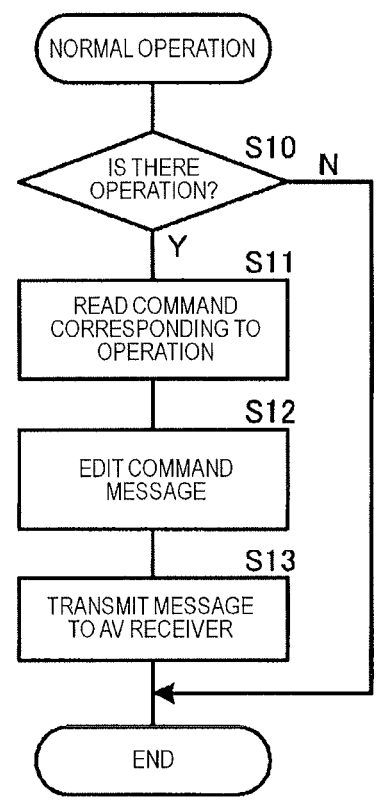
FIG. 5B is a flow chart illustrating an operation of an AV controller.

FIG. 5B is a flow chart illustrating a normal operation of the AV controller 100. The operation is repeatedly performed for each predetermined period (for example, 10 ms). First, it is determined whether there has been an operation input by the user (S10). When there is no operation (NO in S10), the operation is ended as it is. When there is an operation input by the user (YES in S10), a command for performing control according to the operation is read from the command table 501 (S11), the command message containing that command is edited (S12), and the edited message is transmitted to the AV receiver 4 (S13). This enables the user to control the AV system 3 using the mobile telephone 1.

Figure 6:
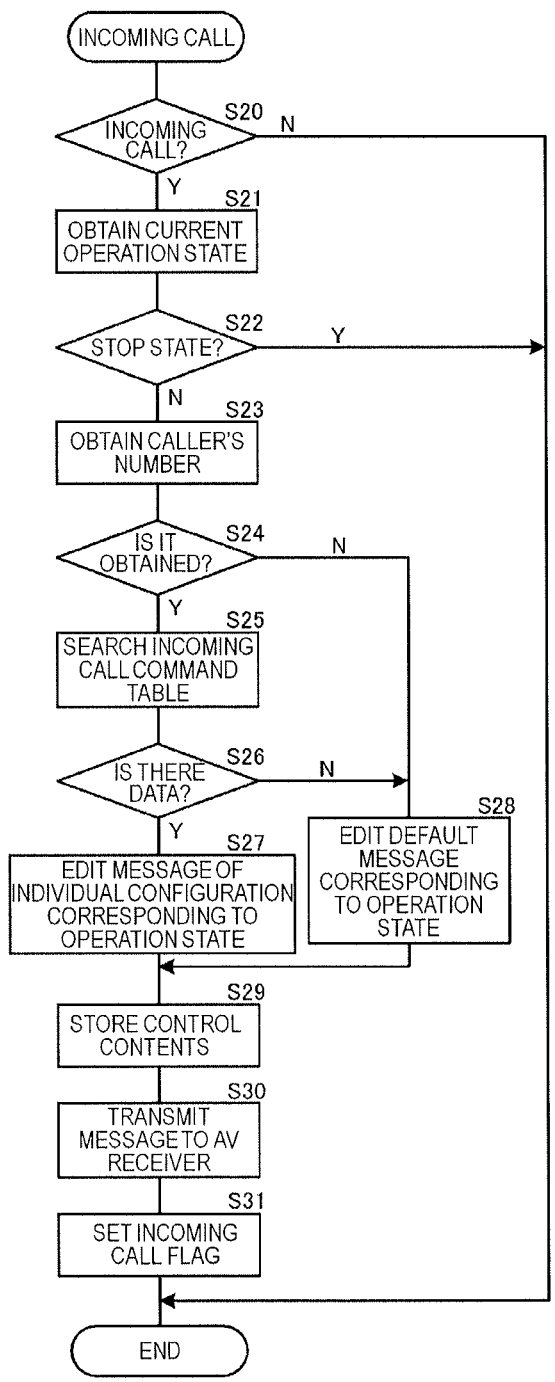
FIG. 6 is a flow chart illustrating an operation of an AV controller.

FIG. 6 is a flow chart illustrating a process at a time of reception of a call. The process is repeatedly performed at each predetermined time (for example, 10 ms). An inquiry is made to the telephone communication unit 200 to determine whether or not there is an incoming telephone call, in other words, it determines whether or not the call status changes from an on-hold call state to an incoming call state (S20). When there is no incoming call (NO in S20), the operation is ended. When there is an incoming call (YES in S20), the operation state of the AV system 3 is obtained (S21). The operation state may be obtained from the AV receiver 4 immediately at this time, but the operation state which is regularly obtained may be used as it is. When the operation state of the current AV system 3 is a stop state, in other words, when there are no voice sounds from the speaker 12 (YES in S22), the operation is ended without doing anything.

When the operation state of the current AV system 3 is not a stop state, in other words, when the reproduction of any audio is performed and there are voice sounds from the speaker 12 (NO in S22), the caller's number is obtained from the telephone communication unit 200 (S23). When the caller's number is obtained (YES in S24), the incoming-call-time command table 501 is searched (S25). Then, when there is data corresponding to the obtained caller's number (YES in S26), an individual command message for the caller corresponding to the current operation state is edited (S27). Meanwhile, when the caller's number cannot be obtained (NO in S24), or when there is no data corresponding to the caller in the incoming-call-time command table 501 (NO in S26), the command message of the default setting is edited (S28).

Then, the contents of the edited command message, in other words, the control contents for the AV system 3 is stored in the incoming control register 234 (S29), and the edited command message is transmitted to the AV receiver 4 (S30). Then, the incoming flag 233 is set. Thus, when the mobile telephone 1 receives a telephone call, regardless of the user operation, it is possible to perform control such as lowering of the reproduced sound volume of the AV system 3 and the like.

Figure 7:
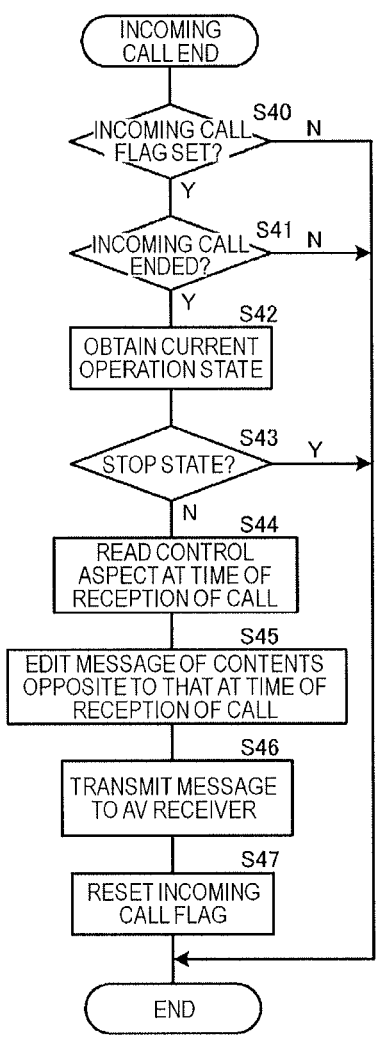
FIG. 7 is a flow chart illustrating an operation of an AV controller.

FIG. 7 is a flow chart illustrating an operation at the time of the end of reception of a call (telephone call). This process is repeatedly performed at each predetermined time (for example, 10 ms). First, it is determined whether or not the incoming flag 233 is set (S40). When the incoming flag 233 is set (YES in S40), it is determined whether or not the incoming call or the telephone call is ended, in other words, whether the call status changes from an incoming call state or a connected call state to an on-hold call state (S41). When the incoming flag 233 is not set (NO in S40), or when the call status is an incoming call state or a connected call state as it is (NO in S41), the operation is ended as it is.

When the incoming call or the telephone call is ended (YES in S41), the operation state of the AV system 3 is obtained (S42). The operation state may be obtained from the AV receiver 4 immediately at this time, but the operation state which is regularly obtained may be used as it is. When the operation state of the current AV system 3 is the stop state, in other words, when no voice sounds from the speaker 12 (YES in S43), the operation is ended without doing anything.

When the operation state of the current AV system 3 is not the stop state, in other words, when the reproduction of any audio is performed and voice sounds from the speaker 12 (NO in S43), the control contents which is performed for the AV system 3 at the time of reception of a call is read from the incoming control register 234 (S44), and a command message for performing the control opposite to the control contents is edited (S45). The opposite control is returning the operation state of the AV system 3 to the state before the reception of a call, and when the original control content is a pause, the opposite control is a play; when the original control content is a muting, the opposite control is a release of the muting; and when the original control content is a sound volume −10 dB, the opposite control is +10 dB. Then, the command message is transmitted to the AV receiver 4 (S46) and the incoming flag 233 is reset (S47), such that the operation is ended.

In the embodiment, since the user may make a call after controlling the AV system 3 with a user's own operation at a time of transmission of a call, the automatic control of the AV system 3 is performed only at a time of reception of a call, but the automatic control may also be performed at a time of transmission of a call. In addition, the automatic control may be performed not at the time of reception of a call, but at a time of response (when call connection is started). In addition, even if a call is received, the operation of FIG. 6 may not be performed in a manner mode.

In addition, when the AV receiver 4 is operated in an incoming call state (telephone call), at the time of end of the incoming call (telephone call) illustrated in FIG. 7, the operation of returning the AV system 3 to the original state may not be performed.

In the embodiment, an AV system including an image and a sound has been described as an example, but the embodiment may also be applied to an audio system including only sound.

REFERENCE SIGNS LIST

1: mobile telephone
5: memory card
20: control unit
41: display unit
50: program
100: AV controller
200: telephone communication unit
231: system configuration storage area
232: operation state storing area
233: incoming flag
234: incoming control register
501: command table
502: incoming-call-time command table

The invention claimed is:

1. A non-transitory storage medium for storing therein an audio device control program that causes a control unit of a mobile telephone equipped with a telephone communication unit to function as:
   an operation detector that detects a user operation;
   an incoming call detector that detects an incoming telephone call to the telephone communication unit;
   a command transmitter that communicates with an audio device that outputs a reproduced sound, wherein the command transmitter transmits a command message containing control contents corresponding to the user operation to the audio device when the operation detector detects the user operation, and transmits a command message for controlling the reproduced sound to the audio device when the incoming call detector detects the incoming telephone call; and
   an operation state obtainer that obtains an operation state of the audio device, the operation state including an audio source selected in the audio device, wherein
   the command transmitter transmits a command message containing control contents corresponding to the audio source selected in the audio device at that time when the incoming call detector detects the incoming telephone call.

2. The storage medium according to claim 1, wherein
   the incoming call detector obtains a caller's number from the telephone communication unit, and
   the command transmitter transmits an individual command message according to the obtained caller's number when the incoming call detector detects the incoming telephone call.

3. The storage medium according to claim 1, wherein
   the command message indicates at least one of lowering a sound volume of the reproduced sound, muting the reproduced sound, reproducing the reproduced sound, and stopping the reproduced sound.

4. The storage medium according to claim 1, wherein
   the incoming call detector further detects that a state of the incoming telephone call or a state of a telephone call is ended, and
   the command transmitter transmits a command message containing control contents for returning to a state before the incoming call detector detects the incoming telephone call to the audio device when the incoming call detector detects that the the state of the incoming telephone call or the state of the telephone call is ended.

5. A mobile telephone comprising:
   the storage medium as defined in claim 1;
   a telephone communication unit that performs a telephone communication; and
   a control unit that executes the audio device control program stored in the storage unit.

6. A control method for controlling a control unit of a mobile telephone equipped with a telephone communication unit, the control method comprising:
   controlling the control unit to function as:
   an operation detector that detects a user operation;
   an incoming call detector that detects an incoming telephone call to the telephone communication unit;
   a command transmitter that communicates with an audio device that outputs a reproduced sound, wherein the command transmitter transmits a command message containing control contents corresponding to the user operation to the audio device when the operation detector detects the user operation, and transmits a command message for controlling the reproduced sound to the audio device when the incoming call detector detects the incoming telephone call; and
   an operation state obtainer that obtains an operation state of the audio device, the operation state including an audio source selected in the audio device, wherein
   the command transmitter transmits a command message containing control contents corresponding to the audio source selected in the audio device at that time when the incoming call detector detects the incoming telephone call.

7. A control method for controlling an audio device from a mobile telephone equipped with a telephone communication unit, the control method comprising:
   detecting a user operation;
   detecting an incoming telephone call to the telephone communication unit;
   communicating with an audio device that outputs a reproduced sound;
   obtaining an operation state of the audio device, wherein the operation state includes an audio source selected in the audio device; and
   transmitting a first command message containing control contents corresponding to the user operation to the audio device when the user operation is detected, and transmitting a second command message for controlling the reproduced sound to the audio device when the incoming telephone call is detected, wherein the second command message contains control contents corresponding to the audio source selected in the audio device at that time when the incoming call detector detects the incoming telephone call.

* * * * *